United States Patent
Lo et al.

(10) Patent No.: US 7,125,783 B2
(45) Date of Patent: Oct. 24, 2006

(54) DIELECTRIC ANTI-REFLECTIVE COATING SURFACE TREATMENT TO PREVENT DEFECT GENERATION IN ASSOCIATED WET CLEAN

(75) Inventors: Guo-Qiang Lo, Portland, OR (US); Ohm-Guo Pan, Portland, OR (US); Zhenjiang Yu, Portland, OR (US); Yu-Lung Mao, Portland, OR (US); Tsengyou Syau, Portland, OR (US); Shih-Ked Lee, Hillsboro, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 622 days.

(21) Appl. No.: 09/838,084

(22) Filed: Apr. 18, 2001

(65) Prior Publication Data

US 2002/0155708 A1  Oct. 24, 2002

(51) Int. Cl.
*H01L 21/762* (2006.01)

(52) U.S. Cl. .................. 438/424; 438/700; 438/906; 438/952; 257/E21.546

(58) Field of Classification Search ........ 438/424–438, 438/221, 296, 717, 704, 763, 786, 952, FOR. 448, 438/FOR. 227, 700, 906; 257/E21.546
See application file for complete search history.

(56) References Cited

U.S. PATENT DOCUMENTS

| | | | | |
|---|---|---|---|---|
| 4,693,781 A | * | 9/1987 | Leung et al. | 438/696 |
| 5,395,790 A | | 3/1995 | Lur | 437/69 |
| 5,492,858 A | | 2/1996 | Bose et al. | 437/67 |
| 5,541,436 A | | 7/1996 | Kwong et al. | 257/410 |
| 5,956,598 A | * | 9/1999 | Huang et al. | 438/424 |
| 6,054,393 A | | 4/2000 | Niccoli | 438/745 |
| 6,057,208 A | | 5/2000 | Lin et al. | 438/424 |
| 6,103,456 A | * | 8/2000 | Tobben et al. | 430/317 |
| 6,129,091 A | | 10/2000 | Lee et al. | 134/3 |
| 6,159,823 A | * | 12/2000 | Song et al. | 438/437 |
| 6,165,854 A | | 12/2000 | Wu | 438/296 |
| 6,265,283 B1 | * | 7/2001 | Nariman et al. | 438/424 |

(Continued)

OTHER PUBLICATIONS

Ghandhi S. "VLSI Fabrication Principles: Silicon and Gallium Arsenide", 1983, John Wiley & Sons, Inc., p. 614.*
Wolf S. "Silicon Processing for the VLSI-ERA: vol. 1-Process Technology", 1986, Lattice Pr., vol. 1, p. 407, 476.*
Lee et al., "Effects Of Post Annealing And Oxidation Processes On The Removal Of Damage Generated During The Shallow Trench Etch Process", Jpn. J. Appl. Phys. vol. 37 (1998) Pt. 1, No. 12B; pp. 6916-6921.

*Primary Examiner*—George Fourson
(74) *Attorney, Agent, or Firm*—Bever, Hoffman & Harms

(57) ABSTRACT

A method for preventing the formation of watermark defects includes the steps of forming a pad oxide, a silicon nitride layer and a silicon oxynitride layer over a semiconductor substrate. A photoresist mask is formed over the resulting structure, with the silicon oxynitride layer being used as an anti-reflective coating during exposure of the photoresist material. An etch is performed through the photoresist mask, thereby forming a trench in the substrate. The photoresist mask is stripped, and the silicon oxynitride layer is conditioned. For example, the silicon oxynitride layer may be conditioned by a rapid thermal anneal in the presence of oxygen or nitrogen. A wet clean step is subsequently performed to remove a native oxide layer in the trench. The conditioned silicon oxynitride layer prevents the formation of watermarks during the wet clean process.

20 Claims, 3 Drawing Sheets

U.S. PATENT DOCUMENTS

| | | | |
|---|---|---|---|
| 6,417,070 B1 * | 7/2002 | Ballantine et al. | 438/424 |
| 6,444,588 B1 * | 9/2002 | Holscher et al. | 438/737 |
| 6,541,382 B1 * | 4/2003 | Cheng et al. | 438/692 |
| 6,930,028 B1 * | 8/2005 | Hanratty et al. | 438/585 |
| 2001/0026979 A1 * | 10/2001 | Chern | 438/289 |
| 2002/0094593 A1 * | 7/2002 | Chiou et al. | 438/29 |

* cited by examiner

US 7,125,783 B2

DIELECTRIC ANTI-REFLECTIVE COATING SURFACE TREATMENT TO PREVENT DEFECT GENERATION IN ASSOCIATED WET CLEAN

FIELD OF THE INVENTION

The present invention relates to the prevention of defects during a semiconductor process. More specifically, the present invention relates to a method for preventing watermark defects when an anti-reflective coating (ARC) is used in conjunction with a wet clean.

RELATED ART

Plasma-deposited silicon oxynitride ($Si_xO_yN_zH_4$), is a dielectric material that has been used as an anti-reflective coating (ARC) on critical layers in photolithographic processes. One problem encountered with the use of silicon oxynitride is that this material is not compatible with hydrogen fluoride (HF) or buffered oxide etch (BOE) based wet clean processes. Plasma-based silicon oxynitride is a complex material having an unusually rich hydrogen (H) content of about 15% and poor film density. Moreover, the surface of plasma-based silicon oxynitride is very hydrophilic. These characteristics result in the formation of small amounts of water containing micro bumps (i.e., watermarks) on a silicon oxynitride layer when the silicon oxynitride is present during an HF or ROE based wet clean process. Some droplets may drop from the surface of the silicon oxynitride layer onto other layers exposed by the HF or BOE wet clean process. These watermarks are difficult to remove.

The presence of watermarks can result in defects that are hereinafter referred to as watermark defects. A watermark defect is typically created when a layer is deposited over a watermark. A watermark defect can appear either immediately after the layer is deposited, or at some subsequent time.

FIG. 1 is a cross-sectional diagram of a semiconductor structure 10 including a substrate 11, pad oxide 12, shallow trench isolation (STI) material 13, and two watermark defects 14–15 located between silicon substrate 11 and STI material 13. Although FIG. 1 illustrates an STI structure, it is understood that watermark defects may exist on many other structures, and that the STI structure is simply illustrated as an example. In general, watermark defects are silicate ($SiO_x$), which is similar to silicon oxide, but has poorer adhesion and greater porosity. The poor adhesion characteristics of silicate watermark defects can result in the detachment of two layers which adjoin the watermark defect. For example, the poor adhesion characteristics of watermark defects 14–15 can result in STI material 13 becoming detached from substrate 11.

The relatively high porosity of a silicate watermark defect causes the watermark defect to exhibit a relatively high etch rate (with respect to silicon oxide) in the presence of HF. Thus, during subsequent HF etch steps, any exposed watermark defects will be rapidly etched, thereby creating voids where the watermark defects previously existed. These voids can result in irregularities in subsequently formed layers, thereby lowering yield and impairing device performance. For example, during an HF etch to remove pad oxide 12, silicate watermark defect 14 will be rapidly etched, thereby creating a void.

It would therefore be desirable to prevent the formation of watermarks, and thereby watermark defects, in a process that uses an HF or BOE based wet clean in the presence of a silicon oxynitride layer.

SUMMARY

Accordingly, the present invention provides a method for preventing the formation of watermark defects, particularly before the formation of shallow trench isolation structures. In one embodiment, a method for preventing the formation of watermark defects includes the steps of sequentially forming a pad oxide layer, a silicon nitride layer and a silicon oxynitride layer over a semiconductor substrate. A photoresist mask is formed over the resulting structure, with the silicon oxynitride layer being used as an anti-reflective coating during an exposure step performed during formation of the photoresist mask. An etch is performed through one or more openings in the photoresist mask, thereby forming one or more corresponding trenches in the semiconductor substrate. After the etch is completed, the photoresist mask is stripped.

After the photoresist mask has been stripped, the silicon oxynitride layer is conditioned. For example, the silicon oxynitride layer may be conditioned by a rapid thermal anneal in the presence of oxygen or nitrogen. Alternatively, the surface of the silicon oxynitride layer may be conditioned at a low temperature in the presence of oxygen. The conditioning step reduces the hydrogen content of the silicon oxynitride layer, thereby densifying this layer. This conditioning changes the properties of the silicon oxynitride layer, such that this layer becomes denser and less hydrophilic. That is, the wettability of the silicon oxynitride layer is reduced.

The silicon oxynitride layer is conditioned after the exposure of photoresist mask, such that the original anti-reflective optical properties of the silicon oxynitride layer are not modified until after these properties are no longer required.

A wet clean step is then performed to remove native oxide from the trenches. The conditioned silicon oxynitride layer advantageously prevents the formation of watermarks during this wet clean process. As a result, the formation of watermark defects is prevented during subsequent processing steps.

After the wet clean has been performed, a liner oxidation layer is thermally grown in the trenches. A shallow trench isolation (STI) layer is then deposited over the resulting structure. A chemical mechanical polishing (CMP) step can then be performed to remove the conditioned silicon oxynitride layer, a portion of the silicon nitride layer and excess STI material.

The present invention will be more fully understood in view of the following description and drawings.

DETAILED DESCRIPTION

FIGS. 2–9 are cross-sectional diagrams of a semiconductor process for preventing the formation of watermark defects in accordance with one embodiment of the present invention.

Figure 1:
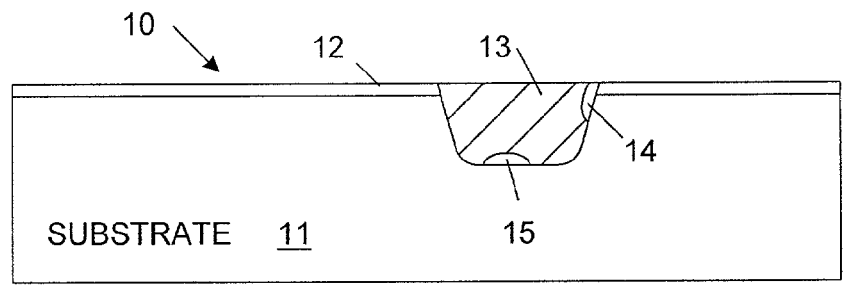
FIG. 1 is a cross-sectional diagram of a conventional shallow trench isolation semiconductor structure having watermark defects.
Figure 2:
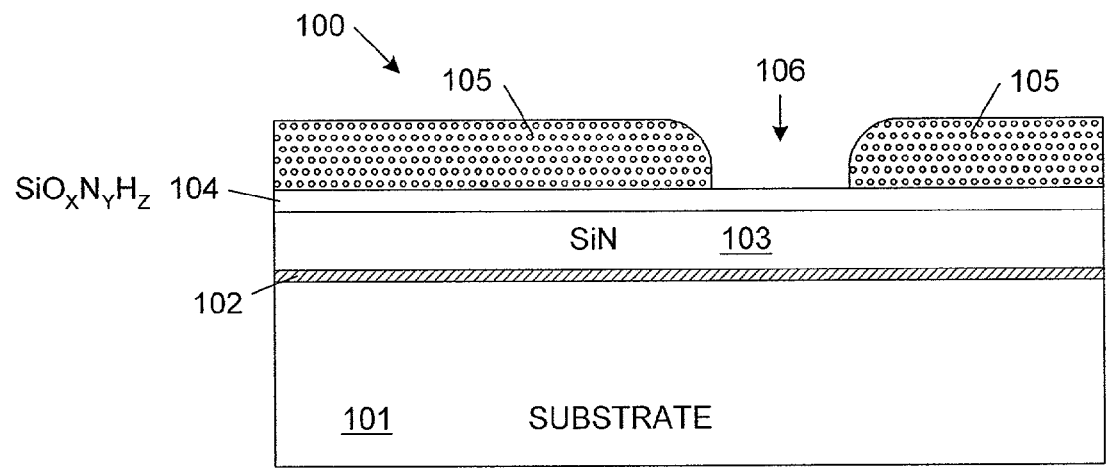
FIGS. 2–9 are cross-sectional diagrams of a semiconductor process for preventing the formation of watermark defects during shallow trench isolation in accordance with one embodiment of the present invention.

As illustrated in FIG. 2, semiconductor structure 100 includes semiconductor substrate 101, pad oxide 102, silicon nitride layer 103, silicon oxynitride layer 104 and photoresist mask 105. In the described embodiment, semiconductor substrate 101 is a lightly doped monocrystalline silicon substrate having a crystal structure of <1,0,0>. However, other semiconductor substrates can be used in other embodiments of the invention.

In the described embodiment, pad oxide 102 is a layer of silicon oxide that is thermally grown at the upper surface of substrate 101 to a thickness in the range of about 80 to 150 Angstroms. Pad oxide 102 is grown using processing techniques that are well known to those of ordinary skill in the art.

Silicon nitride (SiN) layer 103 is then deposited over pad oxide 102 to a thickness in the range of about 1300 to 1700 Angstroms. Silicon nitride layer 103 is deposited using a LPCVD process in which dichlorosilane (DCS) reacts with ammonia ($NH_3$) ($DCS:NH_3$ ratio=1:3) at a temperature of about 800° C. and a pressure of 120–200 mtorr. As described in more detail below, silicon nitride layer 103 forms a hard mask during a subsequent trench etching step.

Silicon oxynitride layer 104 is plasma-enhanced chemical vapor deposited over silicon nitride layer 103 to a thickness in the range of about 200 to 400 Angstroms. In the described embodiment, silicon oxynitride layer 104 is deposited using a process in which silane ($SiH_4$) reacts with nitrous oxide ($N_2O$) at a temperature of 350° C. and a pressure of 5.5 Torr. Silicon oxynitride layer 104 forms an anti-reflective coating (ARC), which improves the quality of exposure during a subsequent photolithography step. During the initial deposition of silicon oxynitride layer 104, the $SiH_4:N_2O$ ratio is about 1:2, such that a lower sub-layer of silicon oxynitride layer 104 comprises SiON. Subsequently, the $SiH_4:N_2O$ ratio is changed to about 1:30 (in-situ), such that a thin upper sub-layer of silicon oxynitride layer 104 comprises silicon oxide. As defined herein, silicon oxynitride layer 104 includes both of these sub-layers.

In addition, silicon oxynitride layer 104 has a composition of $Si_XO_YN_ZH_4$, and has a relatively large porosity. The high porosity of silicon oxynitride layer 104 causes this layer to be very hydrophilic. That is, layer 104 has a tendency to trap liquid. More specifically, silicon oxynitride layer 104 exhibits a nearly 0-degree contact angle with respect to a drop of liquid located on the surface of layer 104. This means that silicon oxynitride layer 104 exhibits almost perfect wettability.

A layer of photoresist material is deposited over silicon oxynitride layer 104. This photoresist layer is exposed through a reticle and then developed and cured, thereby forming photoresist mask 105, which includes opening 106. Opening 106 defines the location of a trench to be formed in substrate 101. Note that silicon oxynitride layer 104 prevents reflection of the light source used to expose the photoresist layer, thereby allowing opening 106 to be formed in a precise manner.

Figure 3:
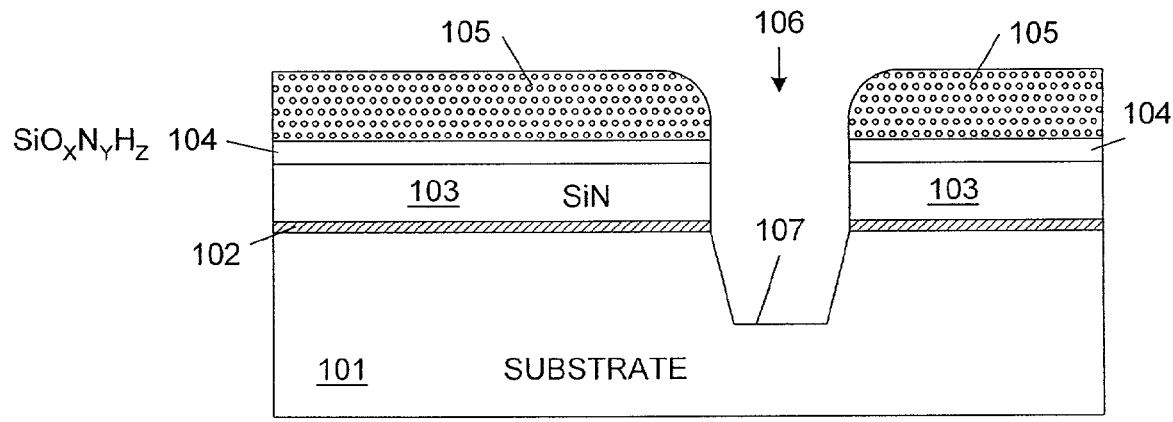

As illustrated in FIG. 3, an etch is performed through opening 106, thereby removing the exposed portion of silicon oxynitride layer 104. This etch continues through silicon nitride layer 103, through pad oxide 102, and into substrate 101, thereby forming trench 107. Trench 107 has a depth in the range of about 3000 to 5000 Angstroms. The sidewalls of trench 107 are formed at angles determined by the crystalline structure of substrate 101. In accordance with one embodiment, this etch is a high-density plasma etch performed in-situ using a $HBr/Cl_2/CF_4$ chemistry.

Figure 4:
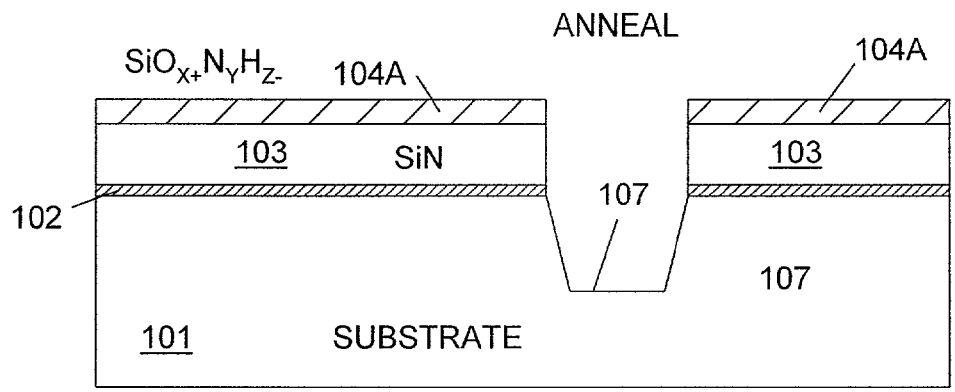

As illustrated in FIG. 4, photoresist mask 105 is stripped by conventional clean/ash and clean steps. In general, the ashing step uses $O_2$ plus a forming gas of $N_2/H_2$ at a temperature of roughly 100–150° C. and a low pressure.

After photoresist mask 105 has been removed, silicon oxynitride layer 104 is conditioned, thereby creating a modified silicon oxynitride layer 104A. Conditioned layer 104A exhibits improved characteristics in view of subsequently performed processing steps. Because silicon oxynitride layer 104 is conditioned after photoresist mask 105 has been patterned, the optical properties of layer 104 are not modified until after these optical properties are no longer required. Thus, the conditioning step can be performed any time after the patterning of photoresist mask 105, but before the next wet clean operation.

In the described embodiment, the conditioning step involves densifying the structure of silicon oxynitride layer 104. This conditioning step further involves reducing the hydrogen content of silicon oxynitride layer 104. In one embodiment, silicon oxynitride layer 104 is conditioned in a furnace in the presence of $O_2$ or $N_2$. In an alternate embodiment, the conditioning of silicon oxynitride layer 104 is accomplished using a rapid thermal anneal (RTA) in the presence of $O_2$ or $N_2$. In one embodiment, a RTA is performed in the presence of $O_2$ for 20 seconds at a temperature of 900° C. Note that $O_2$ is more effective than $N_2$ for reducing the $H_2$ present in silicon oxynitride layer 104. Also note that the parameters of the RTA are limited by the integration scheme for dopant diffusion.

At the end of the RTA, the conditioned silicon oxynitride layer 104A has a composition of $Si_XO_{Y+}N_ZH_{4-}$, where Y+ is greater than Y, and A− is less than A. As a result of the increased density and reduced hydrogen composition, conditioned silicon oxynitride layer 104A is substantially hydrophobic. More specifically, the contact angle of a drop of liquid located on the surface of conditioned silicon oxynitride layer 104A would be significantly greater than 0-degrees, or on the order of about 30–50 degrees. Thus, conditioned silicon oxynitride layer 104A is significantly less wettable than original silicon oxynitride layer 104. As a result, conditioned silicon oxynitride layer 104A will have a lower etch rate in HF than original silicon oxynitride layer 104. Consequently, conditioned silicon oxynitride layer 104A is much less likely than original silicon oxynitride layer 104 to generate watermarks during an HF etch. As a result, watermark defects are virtually eliminated.

In an alternate embodiment, the surface of silicon oxynitride layer 104 is conditioned in-situ at a relatively low temperature, in the range of 300 to 400° C., using a high-density $O_2$-plasma treatment. This plasma treatment is performed at a pressure of around 5.5 Torr, and an $O_2$ flow of about 50 standard liters per minute (slpm) or higher. This low temperature surface conditioning advantageously prevents the entire silicon oxynitride layer 104 from being altered in response to a high temperature anneal. This surface conditioning prevents the formation of watermark defects during a subsequent wet clean step.

After silicon oxynitride layer 104 has been conditioned to form layer 104A, additional process steps, not relevant to the present invention, are performed on areas of substrate 101 that are not illustrated in FIG. 4. Some exemplary process steps include forming another photoresist mask, performing an angled implant to implant the sidewalls of the trench, and stripping the photoresist mask.

Figure 5:
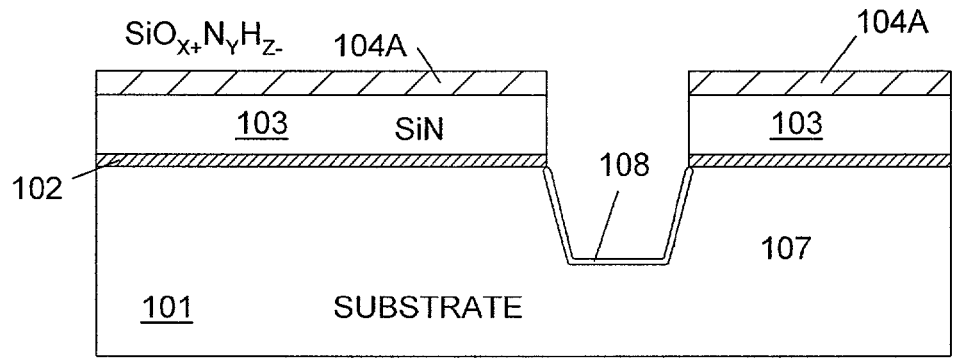

As illustrated in FIG. 5, a thin native oxide layer 108 is formed over the sidewalls and bottom of cavity 107 after the additional process steps have been performed. In the described embodiment, this native oxide layer 108 has a thickness in the range of about 15 to 20 Angstroms.

Figure 6:
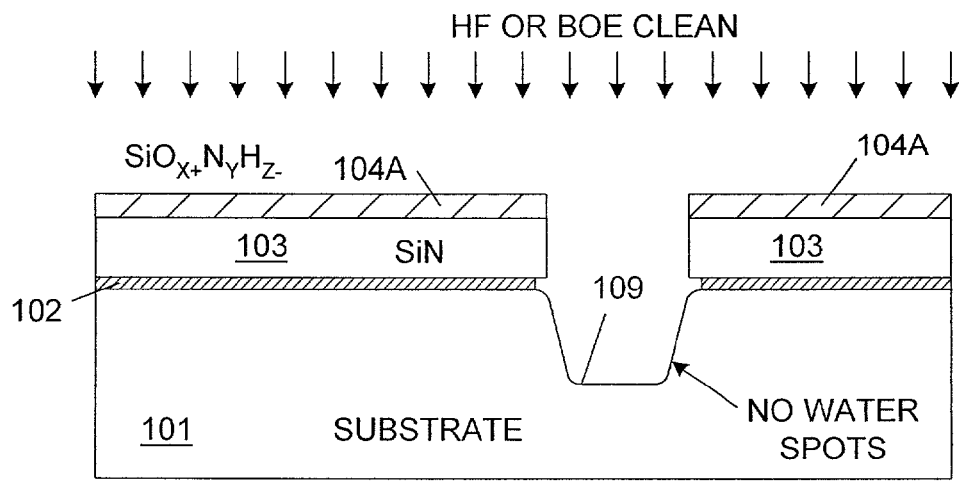

As illustrated in FIG. 6, oxide layer 108 is removed using a HF or BOE wet clean step. In the described embodiment, the wet clean step is performed using a 10:1 HF solution for 10–20 seconds. The wet clean step creates a substantially defect-free trench 109 having rounded edges. Note that the wet clean step undercuts pad oxide 102 to provide rounded edges at the top of trench 109. These rounded edges promote the complete filling of trench 109 with insulating material during subsequent steps. Advantageously, conditioned silicon oxynitride layer 104A does not react with the HF solution used during the wet etch to create watermarks. This is probably because silicon oxynitride layer 104A is relatively dense, and does not easily trap the HF solution. As a result, no watermarks are located on conditioned silicon oxynitride layer 104A or in trench 109 at the end of the wet clean step.

Figure 7:
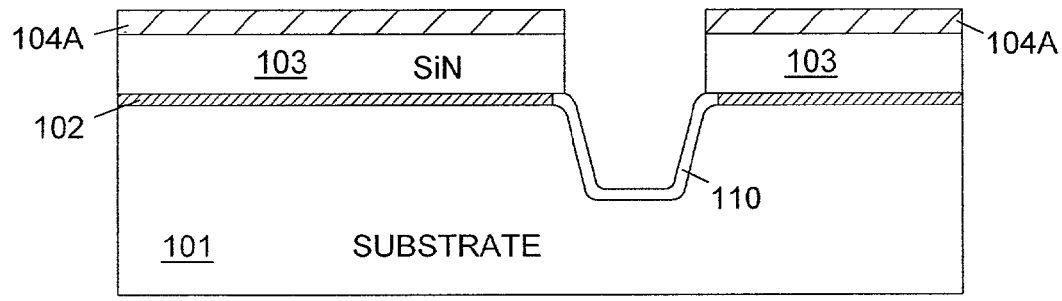

As illustrated in FIG. 7, liner oxidation layer 110 is thermally grown at the sidewalls and bottom of trench 109. In the described embodiment, liner oxidation layer 110 is silicon oxide grown to a thickness in the range of 300 to 500 Angstroms in a dry $O_2$ atmosphere at a temperature in the range of about 1000 to 1150° C. In a particular embodiment, liner oxidation layer 110 is grown to a thickness of about 400 Angstroms. Because there are no watermarks located in trench 109, no watermark defects are formed adjacent to liner oxidation layer 110.

Figure 8:
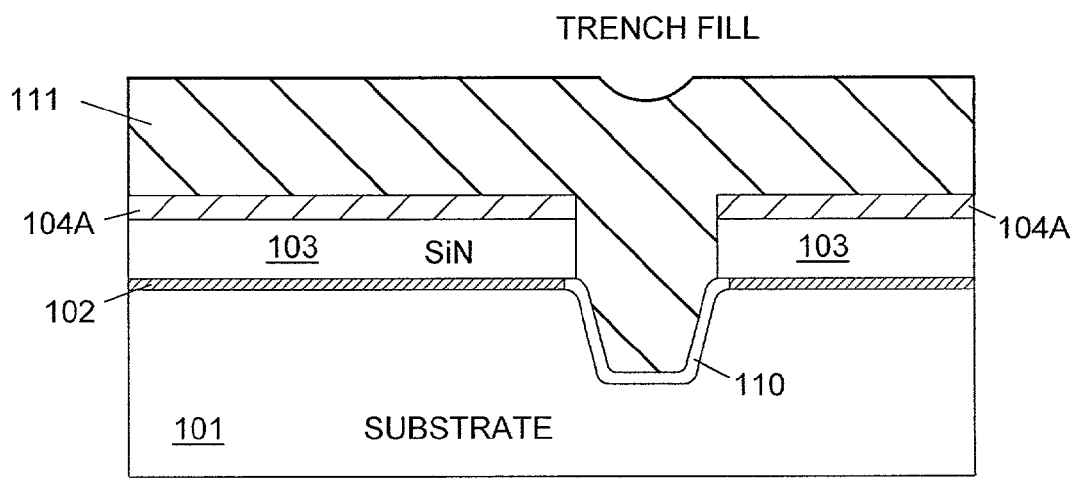

As illustrated in FIG. 8, a shallow trench insulating (STI) layer 111 is deposited over the resulting structure. In the described embodiment, STI layer 111 is a layer of silicon oxide having a thickness of about 8000 Angstroms. STI layer 111 is deposited using a conventional STI filling process, such as a high-density plasma (HDP) or sub-atmosphere CVD (SACVD) process. If a HDP process is used, an $O_2/SiH_4/Ar$ chemistry is used in the presence of a very low pressure.

Figure 9:
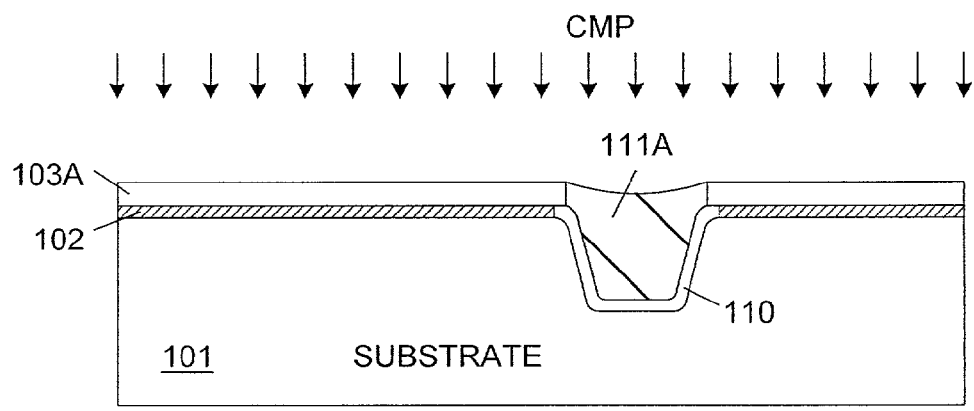

As illustrated in FIG. 9, a chemical-mechanical polishing (CMP) step is then performed to remove the upper portion of STI layer 111, conditioned silicon oxynitride layer 104A and a portion of silicon nitride layer 103. The CMP step is targeted to stop with about 1000 Angstroms of silicon nitride layer 103 remaining.

The portion of STI layer 111 located in trench 109, hereinafter referred to as shallow trench isolation (STI) structure 111A, is not removed by the CMP step. Because no watermarks were present in trench 10.9 (i.e., on liner oxidation 110) when STI layer 111 was deposited, no watermark defects are formed between the liner oxidation 110 and STI structure 111A. As a result, there is a relatively strong adhesion between STI structure 111A and liner oxidation 110, thereby preventing STI structure 111A from tearing off during the CMP step.

Moreover, because there are no watermark defects exposed adjacent to STI structure 111A at the upper surface of the resulting structure, subsequent HF-based wet cleaning steps will not create voids at the interfaces of STI structure 111A, liner oxidation layer 110 and trench 109.

Although the invention has been described in connection with several embodiments, it is understood that this invention is not limited to the embodiments disclosed, but is capable of various modifications, which would be apparent to a person skilled in the art. For example, although the present invention has been described in connection with the fabrication of an STI structure, the present invention is applicable to other processes where HF or BOE based wet cleaning is performed in the presence of silicon oxynitride. Moreover, although the formation of one STI region has been described, it is understood that many STI regions can be formed at the same time. Thus, the invention is limited only by the following claims.

We claim:

1. A method for preventing the formation of watermark defects in a semiconductor process, the method comprising:
   patterning a silicon oxynitride layer having a composition $Si_XO_YN_ZH_A$; then
   etching a trench in a semiconductor substrate through the patterned silicon oxynitride layer; then
   conditioning the patterned silicon oxynitride layer such that the silicon oxynitride layer has a composition $Si_XO_{Y+}N_ZH_{A-}$, wherein no wet clean step is performed between the etching of the trench and the conditioning of the patterned silicon oxynitride layer; and then
   performing a wet clean step in the presence of the conditioned silicon oxynitride layer, wherein the wet clean step cleans the trench in the semiconductor substrate.

2. The method of claim 1, wherein the conditioning step comprises densifying the patterned silicon oxynitride layer.

3. The method of claim 1, wherein the conditioning step comprises a rapid thermal anneal in the presence of oxygen.

4. The method of claim 3, wherein the rapid thermal anneal is performed for about 20 seconds at a temperature of about 900° C.

5. The method of claim 1, wherein the conditioning step comprises a rapid thermal anneal in the presence of nitrogen.

6. The method of claim 1, wherein the conditioning step comprises a high-density oxygen-plasma treatment performed at a temperature in the range of about 300 to 400° C.

7. The method of claim 6, wherein the high-density oxygen-plasma treatment is performed in an oxygen flow of about 50 standard liters per minute (slpm) or higher.

8. The method of claim 7, wherein the high-density oxygen plasma treatment is performed at a pressure of about 5.5 Torr.

9. The method of claim 1, wherein the condition step is performed by heating the patterned silicon oxynitride layer in a furnace in the presence of oxygen.

10. The method of claim 1, wherein the condition step is performed by heating the patterned silicon oxynitride layer in a furnace in the presence of nitrogen.

11. The method of claim 1, further comprising:
    forming a pad oxide layer over a semiconductor substrate;
    forming a silicon nitride layer over the pad oxide layer; and
    forming the silicon oxynitride layer over the silicon nitride layer.

12. The method of claim 11, further comprising:
    forming a photoresist layer over the silicon oxynitride layer; and
    exposing the photoresist layer through a reticle, wherein the silicon oxynitride layer operates as an anti-reflective coating during the exposure;
    developing the exposed photoresist layer, thereby forming a photoresist mask having an opening.

13. The method of claim 12, further comprising etching the silicon oxynitride layer, the silicon nitride layer, the pad oxide and the semiconductor substrate through the photoresist mask, thereby forming the trench in the semiconductor substrate.

14. The method of claim 13, further comprising:
    stripping the photoresist mask; and then
    performing the conditioning step.

15. The method of claim 14, further comprising thermally growing a liner oxide layer in the trench after performing the wet clean step.

16. The method of claim 15, further comprising depositing an insulating material over the liner oxide layer.

17. The method of claim 16, further comprising performing a chemical-mechanical polishing (CMP) step to remove portions of the insulating material, the conditioned silicon oxynitride layer, and portions of the silicon nitride layer.

18. The method of claim 1, further comprising using hydrogen fluoride (HF) in the wet clean step.

19. The method of claim 1, wherein the wet clean step comprises a buffered oxide etch (BOE).

20. The method of claim 1, wherein the wet clean step does not react with the conditioned silicon oxynitride layer.

* * * * *